(12) United States Patent
Kim

(10) Patent No.: US 9,305,652 B2
(45) Date of Patent: Apr. 5, 2016

(54) SEMICONDUCTOR MEMORY DEVICE AND ERASING METHOD THEREOF

(71) Applicant: SK hynix Inc., Incheon-si Gyeonggi-do (KR)

(72) Inventor: Hae Soo Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 270 days.

(21) Appl. No.: 14/191,088

(22) Filed: Feb. 26, 2014

(65) Prior Publication Data

US 2015/0155047 A1  Jun. 4, 2015

(30) Foreign Application Priority Data

Dec. 2, 2013  (KR) .......................... 10-2013-0148724

(51) Int. Cl.
| | |
|---|---|
| *G11C 11/34* | (2006.01) |
| *G11C 16/10* | (2006.01) |
| *G11C 16/04* | (2006.01) |
| *G11C 16/14* | (2006.01) |
| *G11C 16/34* | (2006.01) |

(52) U.S. Cl.
CPC .......... *G11C 16/107* (2013.01); *G11C 16/0483* (2013.01); *G11C 16/14* (2013.01); *G11C 16/3418* (2013.01)

(58) Field of Classification Search
USPC .................................................. 365/185.29
See application file for complete search history.

(56) References Cited

U.S. PATENT DOCUMENTS

| | | | | |
|---|---|---|---|---|
| 2006/0139997 A1* | 6/2006 | Park | .................... | G11C 16/0483 365/185.2 |
| 2006/0203565 A1* | 9/2006 | Lee | ........................ | G11C 16/30 365/185.29 |
| 2013/0258780 A1* | 10/2013 | Khouri | ............... | G11C 16/0483 365/185.17 |
| 2014/0169097 A1* | 6/2014 | Shim | ...................... | G11C 16/24 365/185.17 |
| 2015/0003150 A1* | 1/2015 | Aritome | ............. | G11C 16/3427 365/185.02 |
| 2015/0023103 A1* | 1/2015 | Aritome | ................. | G11C 16/04 365/185.12 |
| 2015/0124530 A1* | 5/2015 | Jung | ................... | G11C 16/0483 365/185.17 |

FOREIGN PATENT DOCUMENTS

| | | |
|---|---|---|
| KR | 1020120052737 A | 5/2012 |
| KR | 1020130035553 A | 4/2013 |

* cited by examiner

*Primary Examiner* — Hoai V Ho

*Assistant Examiner* — Pablo Huerta

(74) *Attorney, Agent, or Firm* — William Park & Associates Ltd.

(57) ABSTRACT

Provided is a semiconductor memory device and a method of erasing the same. The semiconductor memory device includes a memory cell array including a plurality of memory cells; and a peripheral circuit unit configured to apply a pre-erase voltage, an erase voltage, and an erase operation voltage to the memory cell array so as to erase data stored in the plurality of memory cells when an erase operation is performed. The memory cell array includes a plurality of source selection transistors, the plurality of memory cells, and a plurality of drain selection transistors that are connected between a source line and a bit line. When the pre-erase voltage is applied to the source line during the erase operation, different erase operation voltages are applied to an outermost source selection transistor adjacent to the source line among the plurality of source selection transistor and the other selection transistors.

20 Claims, 8 Drawing Sheets

SEMICONDUCTOR MEMORY DEVICE AND ERASING METHOD THEREOF

CROSS-REFERENCE TO RELATED APPLICATION

The present application claims priority to Korean patent application number 10-2013-0148724 filed on Dec. 2, 2013, in the Korean Intellectual Property Office, the entire disclosure of which is incorporated by reference herein.

BACKGROUND

1. Technical Field

The invention generally relates to electronic devices, and more specifically, a semiconductor memory device and an erasing method thereof.

2. Related Art

Semiconductor memory devices are largely classified into volatile memory devices and nonvolatile memory devices.

In a volatile memory device, a write operation and a read operation are performed at high speeds but stored data is lost when a power cutoff occurs. In a nonvolatile memory device, a write operation and a read operation are performed at relative low speeds but stored data is retained even when a power cutoff occurs. Thus, the nonvolatile memory device is used to store data that should be retained regardless of whether a power cutoff occurs. Examples of the nonvolatile memory device include a read only memory (ROM), a mask ROM (MROM), a programmable ROM (PROM), an erasable programmable ROM (EPROM), an electrically erasable programmable ROM (EEPROM), a flash memory, a phase-change random access memory (PCRAM), a magnetic RAM (MRAM), a resistive RAM (ReRAM), a ferroelectric RAM (FRAM), etc. Flash memories are classified into NOR type memories and NAND type memories.

Flash memories have advantages of both a RAM which data can be easily programmed in and erased from and a ROM in which stored data can be retained even when a power cutoff occurs. Flash memories have been widely used as storage media of portable electronic devices such as a digital camera, a personal digital assistant (PDA), and an MP3 player.

Recently, research has been conducted on semiconductor memory devices having a three-dimensional (3D) array structure in order to improve integration degrees of semiconductor memory device. An erase voltage which is a high voltage is applied to such a semiconductor memory device via a source line to perform an erase operation on the semiconductor memory device. In this case, the performance of source selection transistors disposed between the source line and a memory cell may be degraded.

SUMMARY

One aspect of the present disclosure provides a semiconductor memory device including a memory cell array that includes a plurality of memory cells, and a peripheral circuit unit configured to apply a pre-erase voltage, an erase voltage, and an erase operation voltage to the memory cell array so as to erase data stored in the plurality of memory cells when an erase operation is performed. The memory cell array includes a plurality of source selection transistors, the plurality of memory cells, and a plurality of drain selection transistors that are connected between a source line and a bit line. When the pre-erase voltage is applied to the source line during the erase operation, different erase operation voltages are applied to an outermost source selection transistor adjacent to the source line among the plurality of source selection transistor and the other selection transistors.

Other aspects of the present disclosure provide for a semiconductor memory device including a memory cell array that includes a plurality of source selection transistors, a plurality of memory cells, and a plurality of drain selection transistors that are connected between a source line and a bit line, and a peripheral circuit unit configured to apply a pre-erase voltage and an erase voltage to the plurality of memory cells so as to erase data stored in the plurality of memory cells when an erase operation is performed. Different erase operation voltages are applied to at least one source selection transistor adjacent to the source line among the plurality of source selection transistors and the other source selection transistors.

Other aspects of the present disclosure provide for a method of erasing a semiconductor memory device, the method including preparing a semiconductor memory device including a memory cell array which includes a plurality of source selection transistors, a plurality of memory cells, and a plurality of drain selection transistors that are connected between a source line and a bit line, applying a pre-erase voltage to the source line to cause gate induced drain leakage (GIDL) current to flow into a channel of the memory cell array; and applying an erase voltage to the source line so as to erase data stored in the plurality of memory cells. When the pre-erase voltage is applied, different erase operation voltages are applied to an outermost source selection transistor adjacent to the source line among the plurality of source selection transistor and the other source selection transistors.

BRIEF DESCRIPTION OF THE DRAWINGS

The above and other features and advantages of the present disclosure will become more apparent to those of ordinary skill in the art by describing in detail various embodiments thereof with reference to the attached drawings in which.

DETAILED DESCRIPTION

The present disclosure will be described more fully hereinafter with reference to the accompanying drawings, in which examples of embodiments are shown. These embodiments may, however, be embodied in different forms and should not be construed as limited to the embodiments set forth herein.

Features and advantages of the present invention and a method of accomplishing the present invention will be hereinafter described in detail with various examples of embodiments thereof with reference to the attached drawings. However, the present invention is not limited to the embodiments set forth herein and may be embodied in different forms. Rather, these embodiments are provided so that this disclosure will be thorough and complete and will fully convey the concept of the invention to those or ordinary skill in the art.

Throughout this disclosure, it will be understood that when an element or layer is referred to as being "connected to," or "coupled to" another element or layer, it can be directly connected or coupled to the other element or layer, or intervening elements or layers may be present. Also, it will be understood that when an element or layer 'includes' another element or layer, it can further include other elements or layers unless otherwise defined.

Figure 1:
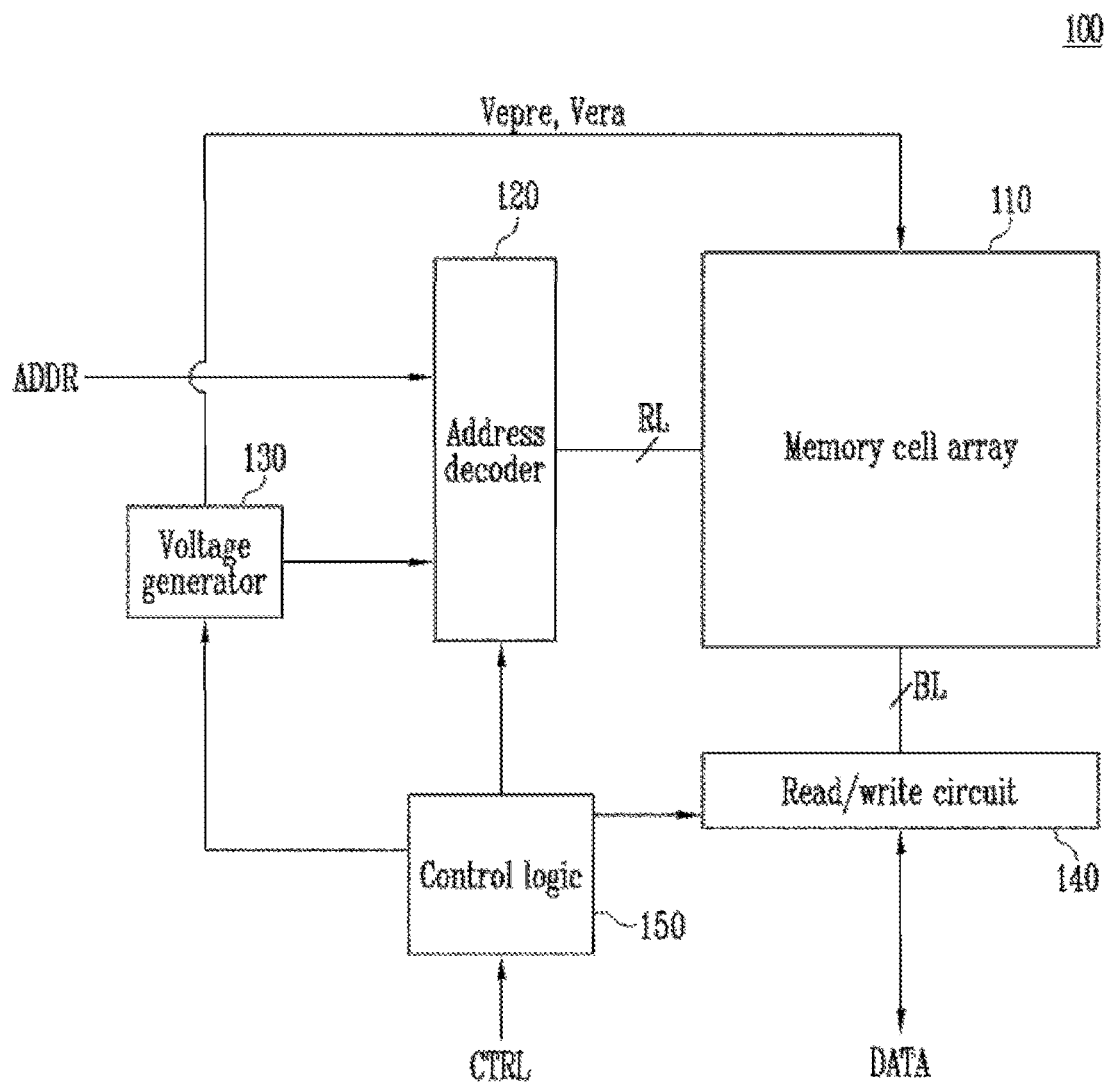
FIG. 1 is a block diagram of a semiconductor memory device according to an example of an embodiment of the present disclosure.

FIG. 1 is a block diagram of a semiconductor memory device 100 according to an example of an embodiment of the present disclosure.

Referring to FIG. 1, the semiconductor memory device 100 includes a memory cell array 110, and a peripheral circuit which may include one or more of the following elements: an address decoder 120, a voltage generator 130, a read/write circuit 140, and a control logic 150.

The memory cell array 110 is connected to the address decoder 120 via row lines RL. The memory cell array 110 is connected to the read/write circuit 140 via bit lines BL.

The memory cell array 110 includes a plurality of memory blocks (not shown). Each of the plurality of memory blocks includes a plurality of cell strings. Each of the plurality of cell strings includes a plurality of memory cells stacked on a substrate (not shown). In an embodiment, the plurality of memory cells are nonvolatile memory cells. In an embodiment, each of the plurality of memory cells may be defined as a single-level cell or a multi-level cell. The memory cell array 110 will be described in greater detail with reference to FIGS. 2 and 3 below.

The address decoder 120 is connected to the memory cell array 110 via the row lines RL. The row lines RL include drain selection lines, word lines, source selection lines, and a common source line. In an embodiment, the row lines RL may further include a pipe selection line.

The address decoder 120 is configured to drive the row lines RL under control of the control logic 150. The address decoder 120 receives an address ADDR from an input/output (IO) buffer (not shown) installed outside or inside the semiconductor memory device 100.

An erase operation is performed on the semiconductor memory device 100 in units of memory blocks. That is, the address ADDR includes a block address in the case of the erase operation. The address decoder 120 is configured to decode the block address. The address decoder 120 selects at least one memory block according to a block address decoded when a pre-erase voltage Vepre and an erase voltage Vera are applied to a channel of the memory cells of the memory cell array 110. Data stored in the memory cells included in the selected memory block is erased by controlling row lines RL connected to the selected memory block.

The address decoder 120 may include a block decoder, a row decoder, an address buffer, etc.

The voltage generator 130 is configured to generate a plurality of voltages from an external voltage applied to the semiconductor memory device 100. The voltage generator 130 is operated under control of the control logic 150.

In an embodiment, the voltage generator 130 may include a circuit for regulating an external voltage to generate a power source voltage. For example, the voltage generator 130 may include a plurality of pumping capacitors, and selectively activate the plurality of pumping capacitors to generate a plurality of voltages. The pre-erase voltage Vepre and the erase voltage Vera among the plurality of voltages are applied to the common source line of the memory cell array 110 and are then delivered to the channel of the memory cells of the selected memory block. Erase operation voltages among the plurality of voltages are applied to the drain selection lines and the source selection lines via the address decoder 120. Here, different erase operation voltages are applied to a drain selection line adjacent to a bit line among the drain selection lines and the other drain selection lines, and different erase operation voltages are applied to a source selection line adjacent to a source line among the source selection lines and the other source selection lines.

The read/write circuit 140 is connected to the memory cell array 110 via the bit lines BL. The read/write circuit 140 is operated under control of the control logic 150.

During an erase operation, the read/write circuit 140 may float the bit lines BL. During a program operation and a read operation, the read/write circuit 140 may communicate data DATA with the IO buffer installed outside or inside the semiconductor memory device 100.

In an example of an embodiment, the read/write circuit 140 may include page buffers (or page registers), a row selection circuit, etc.

The control logic 150 is connected to the address decoder 120, the voltage generator 130, and the read/write circuit 140. The control logic 150 receives a control signal CTRL from the IO buffer installed outside or inside the semiconductor memory device 100. The control logic 150 is configured to control overall operations of the semiconductor memory device 100 according to the control signal CTRL.

The semiconductor memory device 100 may further include the IO buffer. The IO buffer may receive the control signal CTRL and the address ADDR from the outside, and deliver the control signal CTRL and the address ADDR to the control logic 150 and the address decoder 120, respectively. Also, the IO buffer may be configured to deliver data DATA received from the outside to the read/write circuit 140, and deliver data DATA received from the read/write circuit 140 to the outside.

In an example of an embodiment, the semiconductor memory device 100 may be a flash memory device.

Figure 2:
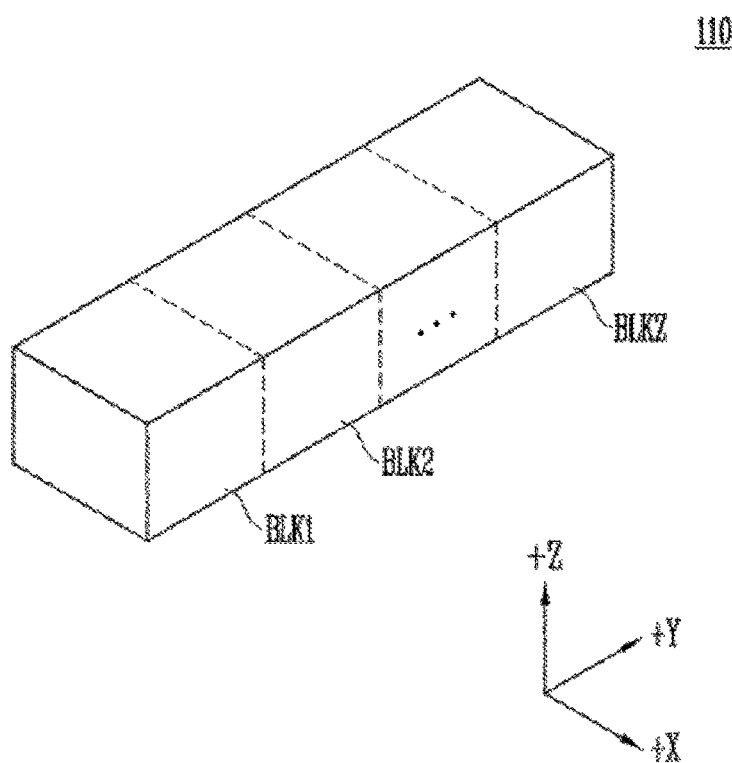
FIG. 2 is a block diagram of a memory cell array of FIG. 1 according to an example of an embodiment of the present disclosure.

FIG. 2 is a block diagram of the memory cell array 110 of FIG. 1 according to an example of an embodiment of the present disclosure;

Referring to FIG. 2, the memory cell array 110 includes a plurality of memory blocks BLK1 to BLKz (where z is a natural number greater than 1). Each of the plurality of memory blocks BLK1 to BLKz has a three-dimensional (3D) structure. Each of the plurality of memory blocks BLK1 to BLKz includes a plurality of memory cells stacked on a substrate (not shown). The plurality of memory blocks BLK1 to BLKz are arranged in an +X-axis direction, a +Y-axis direction, and a +Z-axis direction. The structures of the plurality of memory blocks BLK1 to BLKz will be described in greater detail with reference to FIGS. 3 and 4.

Figure 3:
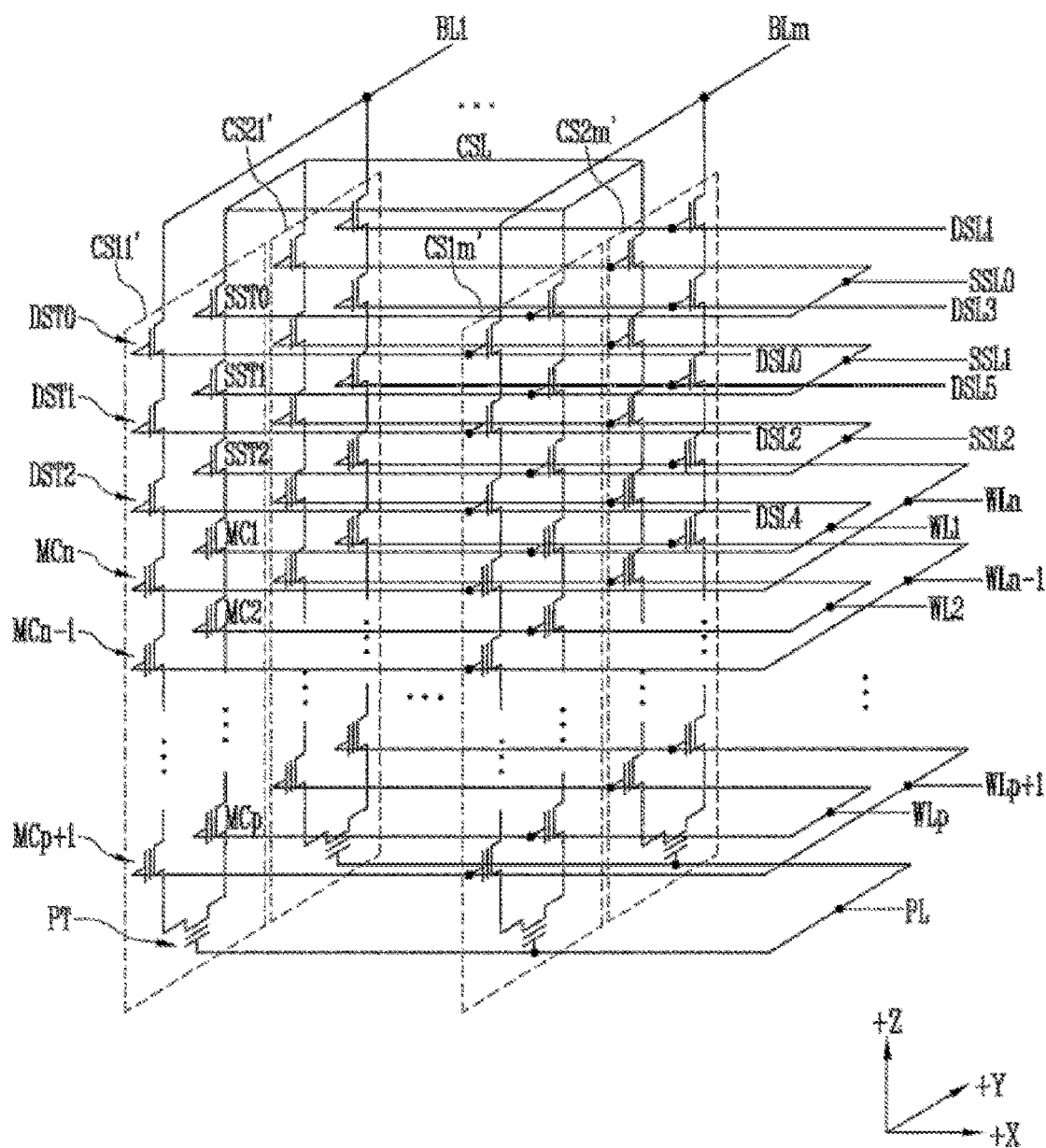
FIG. 3 is a circuit diagram of one of memory blocks of FIG. 2.

FIG. 3 is a circuit diagram of a first memory block BLK1' among the memory blocks BLK1 to BLKz of FIG. 2.

Referring to FIG. 3, the first memory block BLK1' includes a plurality of cell strings CS11' to CS1$m$' and CS21' to CS2$m$'

(where m is a natural number greater than 1). The plurality of cell strings CS11' to CS1m' and CS21' to CS2m' extend in a +Z-axis direction. Each of the plurality of cell strings CS11' to CS1m' and CS21' to CS2m' includes a plurality of source selection transistors SST0 to SST2, first to $n^{th}$ memory cells MC1 to MCn (where n is a natural number greater than 1), and a plurality of drain selection transistors DST0 to DST2 that are stacked in the +Z-axis direction.

Among the plurality of source selection transistors SST0 to SST2 of each of the plurality of cell strings CS11' to CS1m' and CS21' to CS2m', the outermost source selection transistor SST0 is connected to a common source line CSL and the other source selection transistors SST1 and SST2 are connected between the source selection transistor SST0 and the first memory cell MC1. The plurality of source selection transistors SST0 to SST2 are connected to the plurality of source selection lines SSL0 to SSL2, respectively.

In each of the plurality of cell strings CS11' to CS1m' and CS21' to CS2m', a gate of the first memory cell MC1 is connected to a first word line WL1, a gate of the second memory cell MC2 is connected to a second word line WL2, a gate of the third memory cell MC3 is connected to a third word line WL3, a gate of the fourth memory cell MC4 is connected to a fourth word line WL4, and a gate of the $n^{th}$ memory cell MCn is connected to an $n^{th}$ word line WLn (where n is a natural number greater than zero in this case). A pipe transistor PT is disposed between the $p^{th}$ memory cell MCp and the $(p+1)^{th}$ memory cell MCp+1 (where p is a natural number greater than zero). A gate of the pipe transistor PT is connected to a pipe line PL.

Among the plurality of drain selection transistors DST0 to DST2 of each of the plurality of cell strings CS11' to CS1m' and CS21', the outermost drain selection transistor DST0 is connected to a bit line, e.g., a bit line BL1, and the other drain selection transistors DST1 and DST2 are connected between the drain selection transistor DST0 and the $n^{th}$ memory cell MCn. The plurality of drain selection transistors DST0 to DST2 are connected to the plurality of drain selection line DSL0 to DSL5, respectively.

Although the first memory block BLK1' having a structure in which three source selection transistors SST0 to SST2 and three drain selection transistors DST0 to DST2 are arranged has been described above in the present embodiment, at least two source selection transistors and at least two drain selection transistors may be arranged in the first memory block BLK1'. That is, the first memory block BLK1' may include one outermost source selection transistor adjacent to the common source line CSL, at least another source selection transistor, one outermost drain selection transistor adjacent to a bit line, and at least another drain selection transistor.

Drain selection transistors DST0 included in cell strings arranged in the same row, e.g., the +Y-axis direction, are connected to the same bit line. Drain selection transistors DST0 included in the cell strings CS11' and CS21' are connected to the first bit line BL1. Drain selection transistors DST0 included in the cell strings CS1m' to CS2m' are connected to an $m^{th}$ bit line BLm (where m is a natural number greater than zero).

In an embodiment, although not shown in FIG. 3, at least one dummy memory cell may be further provided between the drain selection transistor DST2 and the first to $n^{th}$ memory cells MC1 to MCn, and at least one dummy memory cell may be further provided between the source selection transistor SST2 and the first to $n^{th}$ memory cells MC1 to MCn (where n is an natural number greater than one). In addition, dummy memory cells may be disposed between or adjacent to memory cells for various purposes. FIG. 3 also illustrates word lines WLp and WLp+1 (where p is a natural number greater than zero) and their respective connections.

Figure 4:
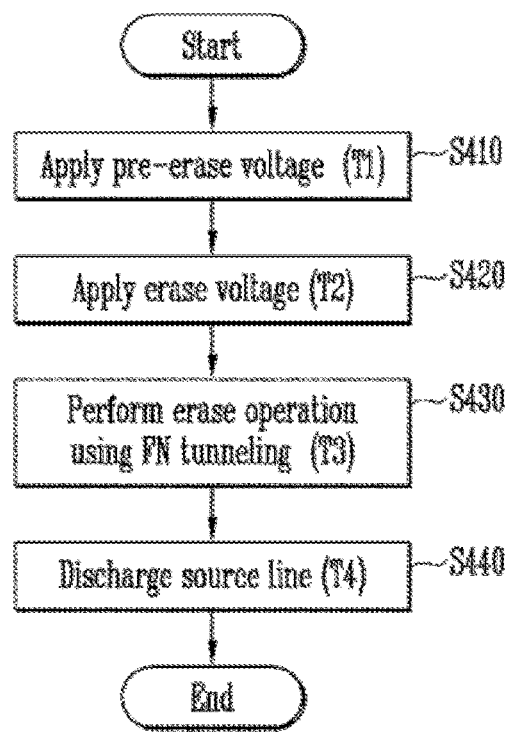
FIG. 4 is a flowchart of an erase operation according to an example of an embodiment of the present disclosure.

FIG. 4 is a flowchart of an erase operation according to an example of an embodiment of the present disclosure.

Figure 5:
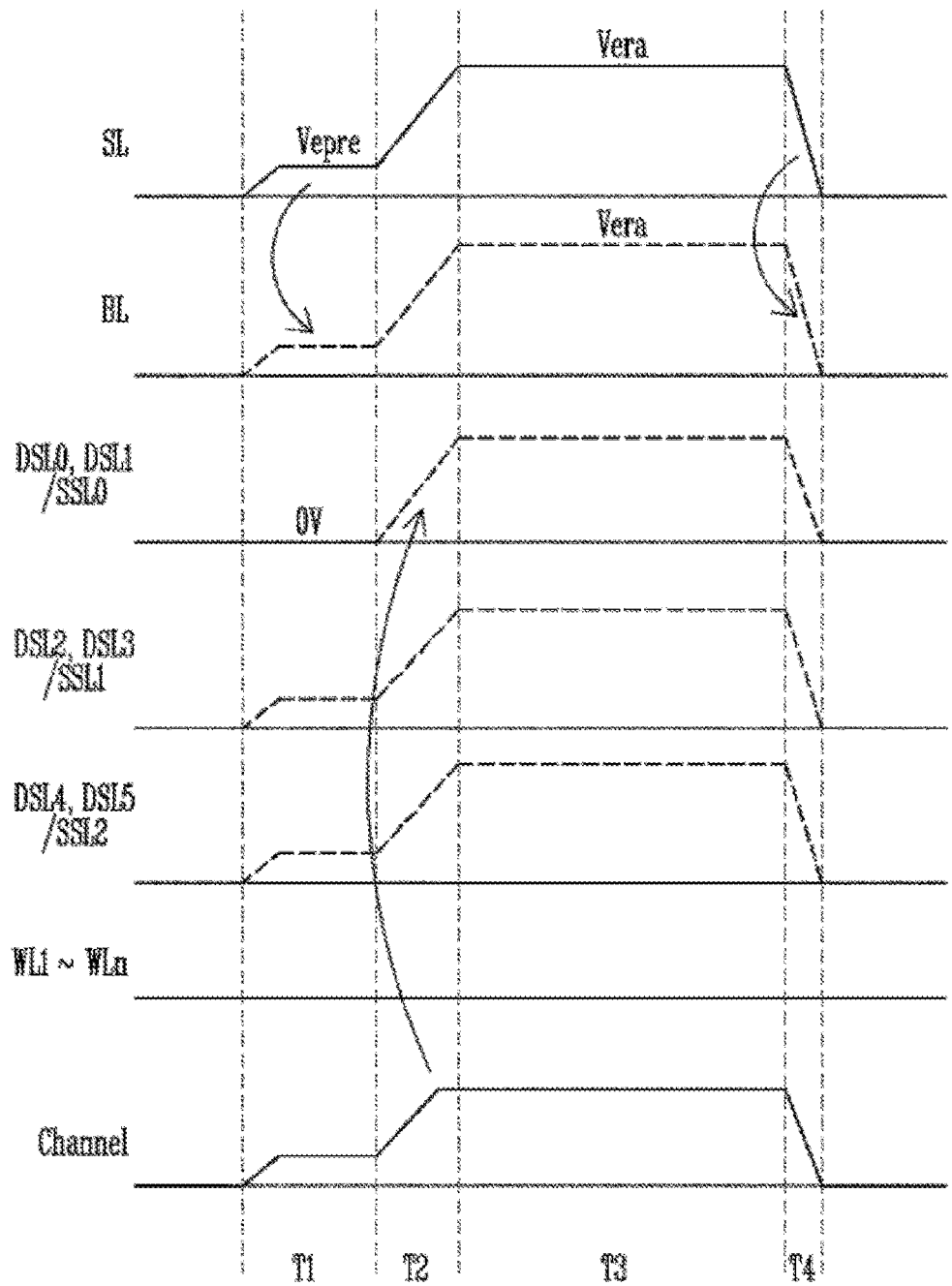
FIG. 5 is a waveform diagram of signals illustrating an erase operation according to an example of an embodiment of the present disclosure.

FIG. 5 is a waveform diagram of signals illustrating an erase operation according to an example of an embodiment of the present disclosure.

Figure 6:
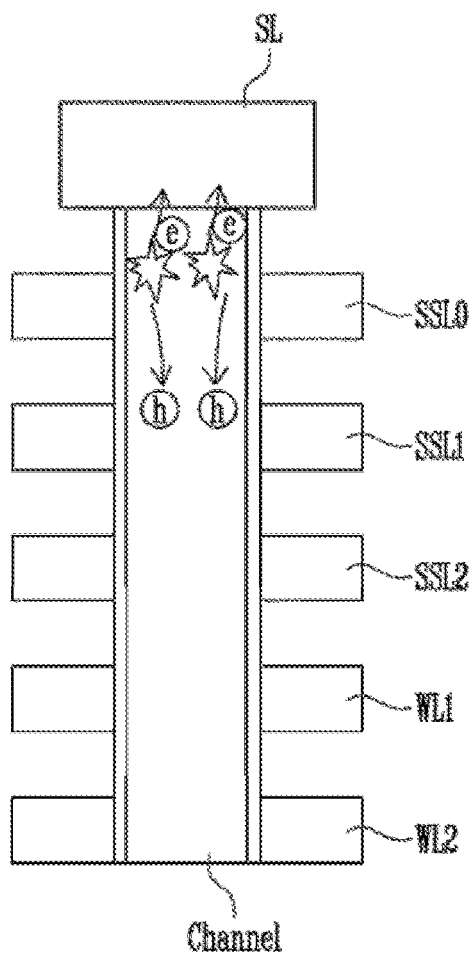
FIG. 6 is a cross-sectional view of a channel for explaining gate induced drain leakage (GIDL) current generated during an erase operation according to an example of an embodiment of the present disclosure.

FIG. 6 is a cross-sectional view of a channel for explaining gate induced drain leakage (GIDL) current generated during an erase operation according to an example of an embodiment of the present disclosure.

An erase operation performed on a semiconductor memory device according to an example of an embodiment of the present disclosure will be described with reference to FIGS. 1 to 6 below.

The present disclosure is applicable to various structures having at least two drain selection transistors and at least two source selection transistors but will be described herein with respect to a structure including three drain selection transistors and three source selection transistors for convenience of explanation.

1) Application of pre-erase voltage (T1) (operation S410)
The voltage generator 130 generates a pre-erase voltage Vepre and the address decoder 120 applies the pre-erase voltage Vepre generated by the voltage generator 130 to the common source line CSL of the memory cell array 110, under control of the control logic 150. In this case, a potential of a bit line adjacent to the common source line CSL (e.g., the bit line BL1) increases due to a coupling phenomenon caused by the pre-erase voltage Vepre applied to the common source line CSL.

An erase operation voltage of 0V is applied to the source selection transistor SST0 adjacent to the common source line CSL and the drain selection transistor DST0 adjacent to a bit line (e.g., the bit line BL1), and thus the outermost source selection transistor SST0 and the outermost drain selection transistor DST0 are turned off. An electric field formed at a gate and a drain of each of the outermost source selection transistor SST0 and the outermost drain selection transistor DST0 that are turned off increases when potentials of the common source line CSL and the bit line BL1 increase. Thus, leakage current flows between the drain and a bulk terminal due to a hole component of an electron-hole pair (EHP) occurring in a drain region and thus gate-induced drain leakage (GIDL) current flows in a direction of a channel. That is, hot holes (h) occur in drain regions of the outermost source selection transistor SST0 and the outermost drain selection transistor DST0 and flow in the direction of the channel, thereby increasing a potential of the channel.

In this case, the other source selection transistors SST1 and SST2 and the other drain selection transistors DST1 and DST2 are controlled to be in a floating state. Although the other source selection transistors SST1 and SST2 and the other drain selection transistors DST1 and DST2 are in the floating state, the hot holes (h) flowing into lower channels of the other source selection transistors SST1 and SST2 and the other drain selection transistors DST1 and DST2 are charge-shared and flow into lower channels of the first and $n^{th}$ memory cells MC1 and MCn due to a potential difference caused by the erase operation voltage of 0V applied to the first word line WL1 and the $n^{th}$ word line WLn.

According to the present disclosure, when a pre-erase voltage Vepre is applied, GIDL current is generated by applying an erase operation voltage of 0V to the outermost source selection transistor SST0 adjacent to the common source line CSL among the plurality of source selection transistors SST0 to SST2, and the source selection transistors SST1 and SST2 are controlled to be in a floating state. Thus, when the GIDL current is generated, a phenomenon that a tunnel insulating film of a selection transistor deteriorates may be limited to the outermost source selection transistor SST0. Also, when the pre-erase voltage Vepre is applied, GIDL current is generated by applying an erase operation voltage of 0V to the outermost drain selection transistor DST0 adjacent to a bit line among the plurality of drain selection transistors DST0 to DST2, and the other drain selection transistors DST1 and DST2 are controlled to be in a floating state. Thus, when the GIDL current is generated, the phenomenon that a tunnel insulating film of a selection transistor deteriorates may be limited to the outermost drain selection transistor DST0. Accordingly, the leakage current characteristics of the source selection transistors SST1 and SST2 and the drain selection transistors DST1 and DST2 are not degraded.

2) Application of erase voltage (T2) (operation S420) The voltage generator 130 generates an erase voltage Vera by increasing a potential of a pre-erase voltage Vepre, and the address decoder 120 applies the erase voltage Vera generated by the voltage generator 130 to the common source line CSL of the memory cell array 110, under control of the control logic 150. In this case, a potential of a bit line adjacent to the common source line CSL (e.g., the bit line BL1) increases due to the coupling phenomenon caused by the erase voltage Vera applied to the common source line CSL.

In this case, the outermost source selection transistor SST0 and the outermost drain selection transistor DST0 to which the erase operation voltage of 0V is applied are controlled to be in a floating state.

A potential of a channel increases according to potentials of the common source line CSL and the bit line BL1, and potentials of the source selection lines SSL0 to SSL2 connected to the plurality of source selection transistors SST0 to SST2 and the drain selection lines DSL0 to DSL5 connected to the drain selection transistors DST0 to DST2, which are in a floating state, increase due to the phenomenon caused by the potential of the channel.

3) Erase Operation Using FN Tunneling (T3) (Operation S430)

Data stored in the first to $n^{th}$ memory cells MC1 to MCn is erased according to the increased potential of the channel. That is, electrons stored in charge storing layers of the first to $n^{th}$ memory cells MC1 to MCn are detrapped by the potential of the channel according to a Fowler-Nordheim (FN) tunneling phenomenon. More specifically, due to the differences between the increased potential of the channel and potentials of a ground level of the word lines WL1 to WLn, either the electrons stored in the charge storing layers potential of the first to $n^{th}$ memory cells MC1 to MCn are discharged to the channel and detrapped, or hot holes generated at the channel flow into the charge storing layers of the first to $n^{th}$ memory cells MC1 to MCn and the electrons stored in the charge storing layers are detrapped. In this case, potentials of the word lines WL1 to WLn may be maintained at the ground level or changed from the floating state to the ground level.

4) Discharging of Source Line (T4) (Operation S440)

After the data stored in the first to $n^{th}$ memory cells MC1 to MCn is erased by performing the erase operation (operation S430), the erase voltage Vera applied to the common source line CSL is blocked and the potential of the common source line CSL is discharged.

In an embodiment of the present disclosure, it is described that an erase operation voltage of 0V is applied to one outermost source selection transistor SST0 and one outermost drain selection transistor DST0 and the other source selection transistors SST1 and SST2 and the other drain selection transistors DST1 and DST2 are controlled to be in a floating state. However, when the number of a plurality of source selection transistors and the number of a plurality of drain selection transistors are each three, at least one outermost source selection transistor and at least one outermost drain selection transistor may be set, the erase operation voltage of 0V may be applied to the at least one outermost source selection transistor and the at least one outermost drain selection transistor, and the other source selection transistors and the other drain selection transistors may be controlled to be in the floating state. That is, the erase operation voltage of 0V may be applied to at least one source selection transistor among the plurality of source selection transistors, the other source selection transistors may be controlled to be in the floating state, the erase operation voltage of 0V may be applied to at least one drain selection transistor among the plurality of drain selection transistors, and the other drain selection transistors may be controlled to be in the floating state.

Figure 7:
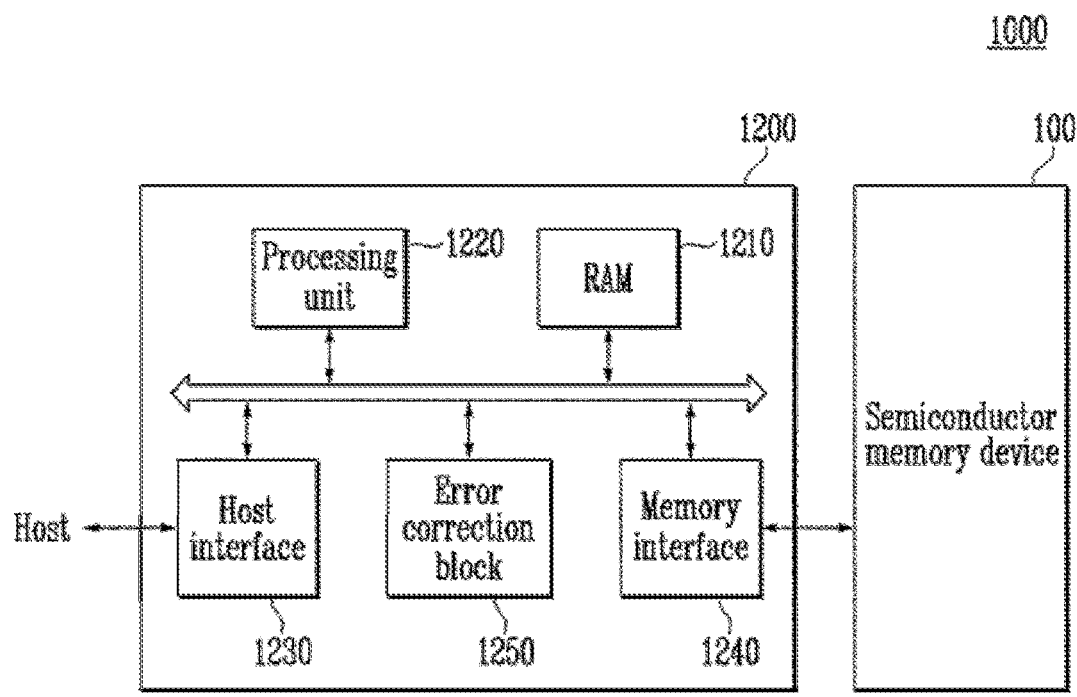
FIG. 7 is a block diagram of a memory system including the semiconductor memory device of FIG. 1 according to an example of an embodiment of the present disclosure.

FIG. 7 is a block diagram of a memory system 1000 including the semiconductor memory device of FIG. 1 according to an example of an embodiment of the present disclosure.

Referring to FIG. 7, the memory system 1000 includes a semiconductor memory device 100 and a controller 1200.

The semiconductor memory device 100 may be configured and operate as described above with reference to FIG. 1. A description of the semiconductor memory device 100 of FIG. 7 that is the same as the description of the semiconductor memory device 100 of FIG. 1 will not be redundantly provided here.

The controller 1200 is connected to a host Host and the semiconductor memory device 100. The controller 1200 is configured to access the semiconductor memory device 100 according to a request from the host Host. For example, the controller 1200 is configured to control a read operation, a write operation, an erase operation, and a background operation of the semiconductor memory device 100. The controller 1200 is configured to provide an interface between the semiconductor memory device 100 and the host Host. The controller 1200 is configured to drive firmware for controlling the semiconductor memory device 100.

The controller 1200 includes a random access memory (RAM) 1210, a processing unit 1220, a host interface 1230, a memory interface 1240, and an error correction block 1250. The RAM 1210 is used as at least one among an operating memory of the processing unit 1220, a cache memory between the semiconductor memory device 100 and the host Host, and a buffer memory between the semiconductor memory device 100 and the host Host. The processing unit 1220 controls overall operations of the controller 1200. Also, the controller 1200 may temporarily store program data provided from the host Host during a write operation.

The host interface 1230 includes a protocol for exchanging data between the host Host and the controller 1200. In an example of an embodiment of the present disclosure, the controller 1200 is configured to communicate with the host Host via at least one among various interface protocols, e.g., a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small-computer small-interface (SCSI) protocol, an enhanced small disk interface (ESDI) protocol, an integrated drive electronics (IDE) protocol, a private protocol, etc.

The memory interface 1240 interfaces with the semiconductor memory device 100. For example, the memory interface 1240 includes a NAND interface or a NOR interface.

The error correction block 1250 is configured to detect and correct an error in data received from the semiconductor memory device 100 using error correcting code (ECC). The processing unit 1220 may adjust a read voltage based on a result of detecting an error in the data by the error correction block 1250, and control the semiconductor memory device 100 to perform a read operation again. In an example of an embodiment, the error correction block 1250 may be provided as a component of the controller 1200.

The controller 1200 and the semiconductor memory device 100 may be integrated as one semiconductor device. In an example of an embodiment, the controller 1200 and the semiconductor memory device 100 may be integrated as one semiconductor device to form a memory card. For example, the controller 1200 and the semiconductor memory device 100 may be integrated as one semiconductor device to form a memory card, such as a PC (personal computer memory card international association (PCMCIA)) card, a compact flash (CF) card, a smart media card (SM or SMC), a memory stick, a multimedia card (MMC, RS-MMC, or MMCmicro), a secure digital (SD, miniSD, microSD, or SDHC) card, a universal flash storage (UFS), etc.

The controller 1200 and the semiconductor memory device 100 may be integrated as one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operating speed of the host Host connected to the memory system 2000 may be greatly improved.

In other examples, the memory system 1000 may be provided as one of various components of an electronic device, such as a computer, an ultra mobile personal computer (UMPC), a workstation, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in a wireless environment, one of various electronic devices forming a home network, one of various electronic devices forming a computer network, one of various electronic devices forming a telematics network, a radio-frequency identification (RFID) device, one of various components that constitute a computer system, etc.

In an example of an embodiment, the semiconductor memory device 100 or the memory system 1000 may be mounted in various types of packages. For example, the semiconductor memory device 100 or the memory system 2000 may be packaged and mounted according to a package-on-package (PoP), ball grid arrays (BGAs), chip-scale packages (CSPs), plastic leaded chip carrier (PLCC), a plastic dual in-line package (PDIP), a die in-waffle pack, a die in-wafer form, a chip-on board (COB), a ceramic dual in line package (CERDIP), plastic metric quad flat pack (MQFP), a thin quad flat pack (TQFP), a small outline (SOIC), a shrink small outline package (SSOP), a thin small outline (TSOP), a thin quad flat pack (TQFP), a system-in package (SIP), a multi-chip package (MCP), a wafer-level fabricated package (WFP), a wafer-level processed stack package (WSP), etc.

Figure 8:
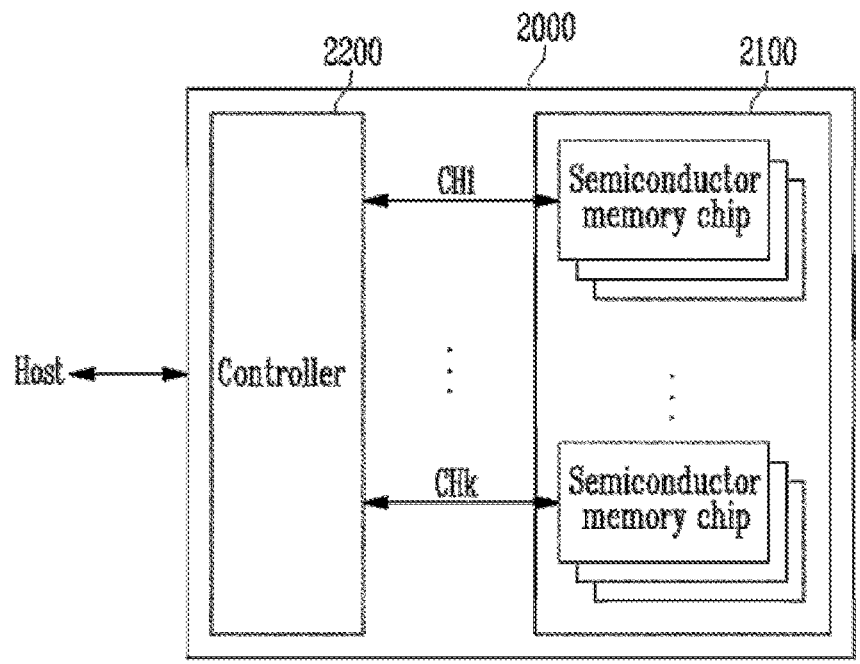
FIG. 8 is a block diagram of an application example of the memory system of FIG. 7.

FIG. 8 is a block diagram of a memory system 2000 as an application example of the memory system 1000 of FIG. 7.

Referring to FIG. 8, the memory system 2000 includes a semiconductor memory device 2100 and a controller 2200.

The semiconductor memory device 2100 includes a plurality of semiconductor memory chips. The plurality of semiconductor memory chips are divided into a plurality of groups.

In FIG. 8, the plurality of groups communicate with the controller 2200 via first to $k^{th}$ channels CH1 to CHk (where k is a natural number greater than one), respectively. Each of the plurality of semiconductor memory chips may be configured and operate similar to the semiconductor memory device 100 described above with reference to FIG. 1.

The plurality of groups are configured to communicate with the controller 2200 via one common channel. The controller 2200 is configured similar to the controller 1200 described above with reference to FIG. 7, and to control the plurality of memory chips of the semiconductor memory device 2100 via the plurality of channels CH1 to CHk.

Figure 9:
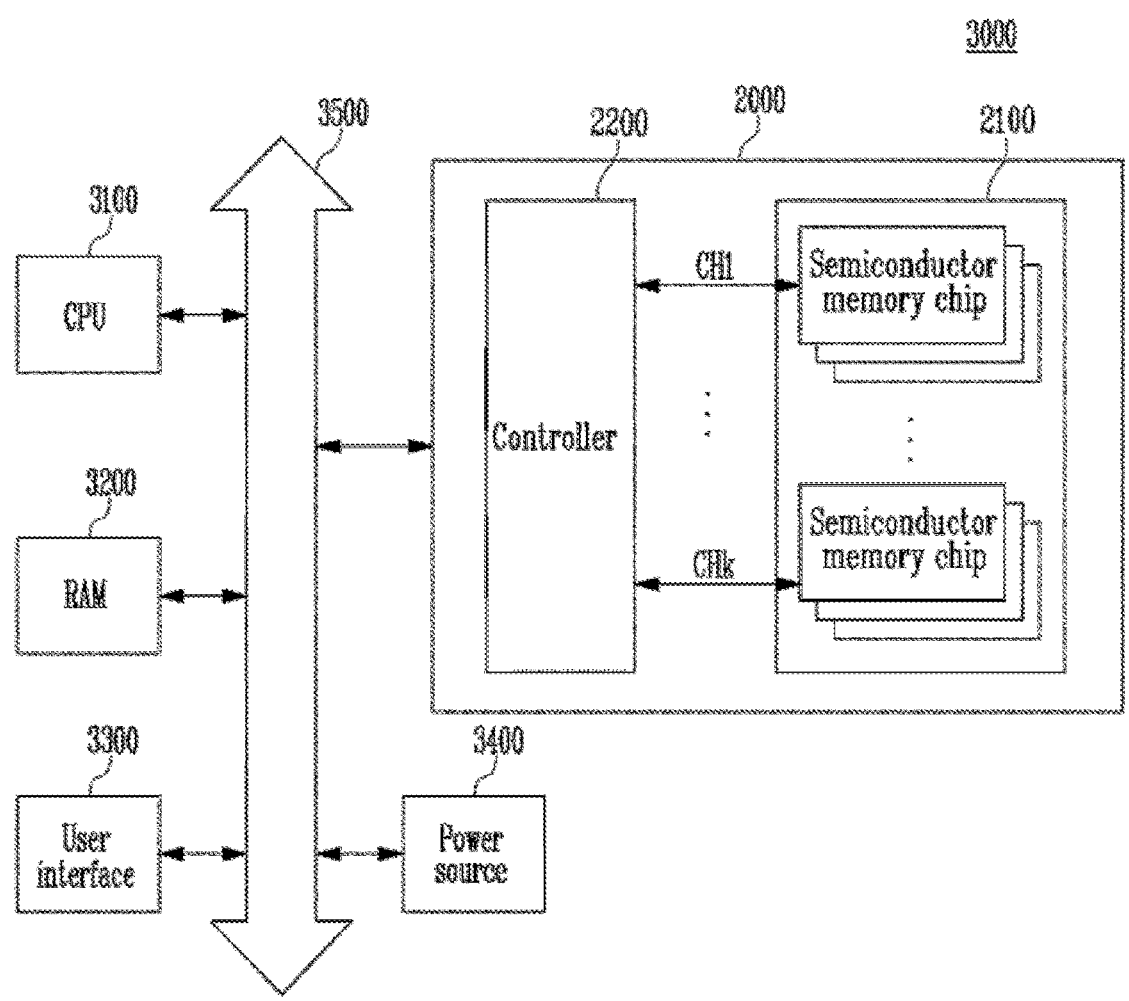
FIG. 9 is a block diagram of a computer system including the memory system of FIG. 8 according to an example of an embodiment of the present disclosure.

FIG. 9 is a block diagram of a computer system 3000 including the memory system 2000 of FIG. 8 according to an example of an embodiment of the present disclosure.

Referring to FIG. 9, the computer system 3000 includes a central processing unit (CPU) 3100, a RAM 3200, a user interface 3300, a power source 3400, a system bus 3500, and a memory system 2000.

The memory system 2000 is electrically connected to the CPU 3100, the RAM 3200, the user interface 3300, and the power source 3400 via the system bus 3500. Data provided via the user interface 3300 or processed by the CPU 3100 is stored in the memory system 2000.

In FIG. 9, a semiconductor memory device 2100 is illustrated as being connected to the system bus 3500 via the controller 2200. However, the semiconductor memory device 2100 may be configured to be directly connected to the system bus 3500. In this case, functions of the controller 2200 may be performed by the CPU 3100 and the RAM 3200.

In FIG. 9, the memory system 2000 described above with reference to FIG. 8 is illustrated as being provided in the computer system 3000. However, the memory system 2000 may be replaced with the memory system 1000 described above with reference to FIG. 7. In other examples of embodiments, the computer system 3000 may be configured to include both the memory systems 1000 and 2000 described above with reference to FIGS. 7 and 8.

According to the present disclosure, a plurality of source selection transistors and a plurality of drain selection transistors may be disposed in a memory cell array, and an erase operation voltage is applied to an outermost selection transistor and the other selection transistors are floated during an erase operation, thereby limiting the phenomenon that a tunnel insulating film of a selection transistor deteriorates to the outermost selection transistor. Accordingly, leakage current characteristics of the selection transistors may be improved.

In the drawings and specification, there have been disclosed typical examples of embodiments of the disclosure and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:
1. A semiconductor memory device comprising:
a memory cell array including a plurality of memory cells; and
a peripheral circuit unit configured to apply a pre-erase voltage, an erase voltage, and an erase operation voltage to the memory cell array so as to erase data stored in the plurality of memory cells when an erase operation is performed, wherein the memory cell array comprises a plurality of source selection transistors, the plurality of memory cells, and a plurality of drain selection transistors that are connected between a source line and a bit line, and when the pre-erase voltage is applied to the source line during the erase operation, different erase operation voltages are applied to an outermost source selection transistor adjacent to the source line among the plurality of source selection transistor and the other selection transistors.

2. The semiconductor memory device of claim 1, wherein, when the pre-erase voltage is applied to the source line during the erase operation, different erase operation voltages are applied to an outermost drain selection transistor adjacent to the bit line among the plurality of drain selection transistor and the other drain selection transistors.

3. The semiconductor memory device of claim 2, wherein, when the pre-erase voltage is applied to the source line during the erase operation, the erase operation voltages applied to the outermost source selection transistor and the outermost drain selection transistor are 0V.

4. The semiconductor memory device of claim 2, wherein, when the pre-erase voltage is applied to the source line during the erase operation, the other source selection transistors and the other drain selection transistors are floated.

5. The semiconductor memory device of claim 1, wherein, when the pre-erase voltage is applied to the source line during the erase operation, the plurality of source selection transistors and the plurality of drain selection transistors are controlled to be in a floating state.

6. The semiconductor memory device of claim 2, wherein the peripheral circuit unit comprises:
   a voltage generator configured to generate the pre-erase voltage, the erase voltage, and the erase operation voltage; and
   a write and read circuit connected to the bit line and configured to float the bit line during the erase operation.

7. The semiconductor memory device of claim 6, wherein, when the pre-erase voltage is applied to the source line during the erase operation, the voltage generator applies the erase operation voltage of 0V to the outermost source selection transistor and the outermost drain selection transistor and floats the other source selection transistors and the other drain selection transistors.

8. A semiconductor memory device comprising:
   a memory cell array including a plurality of source selection transistors, a plurality of memory cells, and a plurality of drain selection transistors that are connected between a source line and a bit line; and
   a peripheral circuit unit configured to apply a pre-erase voltage and an erase voltage to the plurality of memory cells so as to erase data stored in the plurality of memory cells when an erase operation is performed,
   wherein different erase operation voltages are applied to at least one source selection transistor adjacent to the source line among the plurality of source selection transistors and the other source selection transistors.

9. The semiconductor memory device of claim 8, wherein different erase operation voltages are applied to at least one drain selection transistor adjacent to the bit line among the plurality of drain selection transistors and the other drain selection transistors.

10. The semiconductor memory device of claim 9, wherein, when the pre-erase voltage is applied to the source line during the erase operation, the erase operation voltages applied to the at least one source selection transistor and the at least one drain selection transistor are 0V.

11. The semiconductor memory device of claim 9, wherein, when the pre-erase voltage is applied to the source line during the erase operation, the other source selection transistors and the other drain selection transistors are floated.

12. The semiconductor memory device of claim 8, wherein, when the pre-erase voltage is applied to the source line during the erase operation, the plurality of source selection transistors and the plurality of drain selection transistors are controlled to be in a floating state.

13. The semiconductor memory device of claim 9, wherein the peripheral circuit unit comprises:
   a voltage generator configured to generate the pre-erase voltage, the erase voltage, and the erase operation voltage; and
   a write and read circuit connected to the bit line and configured to float the bit line during the erase operation.

14. The semiconductor memory device of claim 13, wherein, when the pre-erase voltage is applied to the source line during the erase operation, the voltage generator applies the erase operation voltage of 0V to the at least one source selection transistor and the at least one drain selection transistor and floats the other source selection transistors and the other drain selection transistors.

15. A method of erasing a semiconductor memory device, comprising:
   preparing a semiconductor memory device including a memory cell array which includes a plurality of source selection transistors, a plurality of memory cells, and a plurality of drain selection transistors that are connected between a source line and a bit line;
   applying a pre-erase voltage to the source line to cause gate induced drain leakage (GIDL) current to flow into a channel of the memory cell array; and
   applying an erase voltage to the source line so as to erase data stored in the plurality of memory cells,
   wherein, when the pre-erase voltage is applied, different erase operation voltages are applied to an outermost source selection transistor adjacent to the source line among the plurality of source selection transistor and the other source selection transistors.

16. The method of claim 15, wherein, when the pre-erase voltage is applied, different erase operation voltages are applied to an outermost drain selection transistor adjacent to the bit line among the plurality of drain selection transistor and other drain selection transistors.

17. The method of claim 16, wherein, when the pre-erase voltage and the erase voltage are applied to the source line, the bit line is in a floating state.

18. The method of claim 16, wherein, when the pre-erase voltage is applied, the erase operation voltages applied to the outermost source selection transistor and the outermost drain selection transistor are 0V.

19. The method of claim 16, wherein, when the pre-erase voltage is applied, the other source selection transistors and the other drain selection transistors are floated.

20. The method of claim 16, wherein, when the erase voltage is applied, the plurality of source selection transistors and the plurality of drain selection transistors are controlled to be in a floating state.

* * * * *